(12) United States Patent
Witmer et al.

(10) Patent No.: US 9,781,853 B1
(45) Date of Patent: Oct. 3, 2017

(54) DISPLAY STACK ENCLOSURE

(71) Applicant: Amazon Technologies, Inc., Reno, NV (US)

(72) Inventors: Gregory Turner Witmer, Portola Valley, CA (US); Christopher Thomas Li, Mountain View, CA (US); Bryan Dan Trinh, San Jose, CA (US)

(73) Assignee: Amazon Technologies, Inc., Reno, NV (US)

( * ) Notice: Subject to any disclaimer, the term of this patent is extended or adjusted under 35 U.S.C. 154(b) by 220 days.

(21) Appl. No.: 14/303,154

(22) Filed: Jun. 12, 2014

(51) Int. Cl.
*G02F 1/1333* (2006.01)
*H05K 7/12* (2006.01)

(52) U.S. Cl.
CPC ......... *H05K 7/12* (2013.01); *G02F 1/133308* (2013.01)

(58) Field of Classification Search
CPC ................................................ G02F 1/133308
See application file for complete search history.

(56) References Cited

U.S. PATENT DOCUMENTS

| | | | | |
|---|---|---|---|---|
| 2004/0109097 A1* | 6/2004 | Mai | ..................... | G02F 1/13338 349/12 |
| 2009/0090694 A1* | 4/2009 | Hotelling | ................. | G06F 3/044 216/41 |
| 2010/0203931 A1* | 8/2010 | Hynecek | ................ | A45C 11/00 455/575.8 |
| 2011/0102701 A1* | 5/2011 | Teng | ................. | G02F 1/133308 349/58 |
| 2012/0162087 A1* | 6/2012 | Hou | ....................... | G06F 1/1626 345/173 |
| 2013/0141665 A1* | 6/2013 | Huang | .............. | G02F 1/133308 349/60 |
| 2014/0092631 A1* | 4/2014 | Fujii | ......................... | G09F 9/30 362/611 |
| 2014/0262855 A1* | 9/2014 | Gandhi | .................. | A45C 11/00 206/45.24 |
| 2015/0370376 A1* | 12/2015 | Harley | ................. | G06F 3/0414 345/174 |

OTHER PUBLICATIONS

"BlackBerry PlayBook Teardown", retrieved from the internet on May 5, 2014 at http://www.ifixit.com/Teardown/BlackBerry+PlayBook+Teardown/5265, © 2014 iFixit, 8 pages.
"iPad Wi-Fi Teardown", retrieved from the internet on May 5, 2014 at http://www.ifixit.com/Teardown/iPad+Wi-Fi+Teardown/2183, © 2014 iFixit, 29 pages.
"Nook Simple Touch with GlowLight Teardown", retrieved from the internet on May 5, 2014 at http://www.ifixit.com/Teardown/Nook+Simple+Touch+with+GlowLight+Teardown/9301, © 2014 iFixit, 9 pages.

* cited by examiner

*Primary Examiner* — Edmond Lau
(74) *Attorney, Agent, or Firm* — Lee & Hayes, PLLC

(57) ABSTRACT

Describe herein are electronic devices that includes an enclosure having a flexible portion extending partially over the coverglass. In some instances, the flexible portion is configured to deform during assembly to allow the coverglass to be placed within the enclosure and to return to an original position once the assembly is complete. In other instances, the flexible portion may be configured to act as a bezel and to conceal any gap between an edge of the coverglass and a side wall of the enclosure from view.

20 Claims, 11 Drawing Sheets

DISPLAY STACK ENCLOSURE

BACKGROUND

A large and growing population of users is enjoying entertainment through the consumption of digital content, such as music, movies, images, electronic books, and so on. The users employ various devices with electronic displays such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth to view the digital content. Electronic displays may present various types of information, such as user interfaces, device operational status, digital content items, and the like, depending on the kind and purpose of the associated device. The appearance and quality of a display can affect the user's experience with the electronic device and the content presented thereon. Accordingly, finding ways to enhance user experience and satisfaction continues to be a priority.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
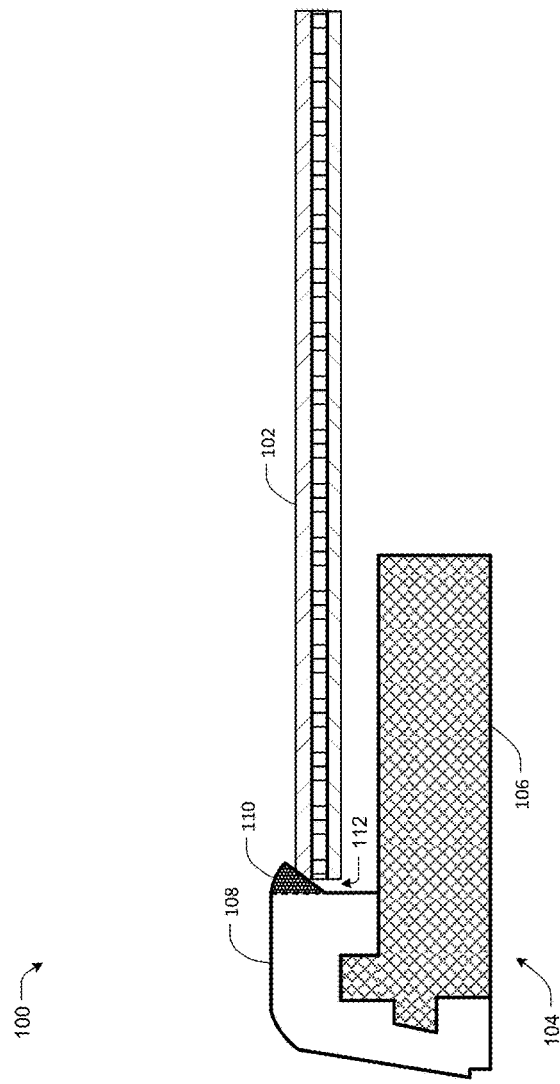
FIG. 1 illustrates an example cross-section of a display stack and display stack enclosure of a first or left side of an electronic device.

This disclosure describes, in part, electronic devices that include electronic displays for displaying digital content to one or more users. In some particular examples, this disclosure describes ways to manufacture or assemble display stacks within a display stack enclosure or housing of the electronic device. For instance, in some implementations, the display stack enclosure may include a flexible portion or flexible rim that, when in an original or assemble position, extends at least partially over the display stack or more particularly, over the coverglass of the display stack. In some examples, the flexible portion may be configured to deform during assembly to allow the display stack to be pushed past the flexible portion into the enclosure. Once the display stack is inserted or otherwise installed into the enclosure, the flexible portion may return to the original position to hold or retain the display stack in the enclosure.

In some implementations, the flexible portion may be configured to form an interference fit with the displays stack and an air gap is formed between the interior wall of the enclosure and the edge of the display stack. In this manner, the flexible portion may cover or hide the air gap, as well as the edge of the display stack or coverglass from view. In other implementations, the display stack may be configured to move or flex within the enclosure, for instance, to receive one or more user inputs. In this implementation, the air gap may allow the display stack to move within the enclosure without experience significant friction.

In general, the display stack enclosure or housing may include a rigid portion, in addition to the flexible portion or flexible rim. For example, the rigid portion may be formed from a metallic material, a plastic material, other type of rigid material, or a combination thereof and may be configured to provide strength and stiffness to the device, as well as to protect the display stack (for instance, in the event of dropping). In some particular examples, the rigid portion may be configured as the main exterior portion of the electronic device. In some cases, the display stack enclosure may include multiple metallic portions, multiple plastic portions arranged to allow communication via various wireless components, and at least one flexible portion extending over a portion of the display stack or coverglass to maintain the display stack within the enclosure.

In some implementations, the flexible portion may be formed from a material having a hardness rating greater than or equal to approximately Shore A 60 and less than or equal to approximately Shore A 90. In one particular example, the flexible portion may be formed from thermoplastic polyurethane (TPU) having a hardness of about Shore A 85. In other examples, the flexible portion may be formed from other silicone materials (e.g., a silicone rubber) and/or thermoplastic elastomers (TPE), such as styrenic block copolymers (TPE-s), polyolefin copolymers (TPE-s), elastomeric alloys (TEP-v), thermoplasitc coployester, thermoplastic polyamides, and/or a combination thereof.

In general, the display stack includes a firm or ridged body with a back portion and a side wall portion that the flexible portion extends outward from to at least partially cover the display stack or coverglass. For example, the flexible portion may form a rim, perimeter cover, lip, or bezel over the side edge of the display stack or coverglass. In some instances, the flexible rim, perimeter cover, lip, or bezel assists in maintain the display stack within the enclosure following assembly of the device. In some implementations, the flexible portion that extends over the display stack or coverglass may be between 0.025 millimeters (mm) and 0.5 mm. In other examples, the portion may be between 0.25 mm and 0.5 mm. In one particular example, the portion may extend no more than 0.3 mm form the side wall of the enclosure.

In some implementations, by forming the rim, perimeter cover, lip, or bezel from a flexible material during assembly the display stack and/or coverglass may be pushed through the m, perimeter cover, lip, or bezel in lieu of spring action or moving parts to hold the rim, perimeter cover, lip, or bezel out of the way of the display stack, as the display stack is placed within the enclosure. Thus, by forming the rim, perimeter cover, lip, or bezel from a flexible material, the overall assembly of the electronic device is less complex, cheaper, and faster.

In some implementations, portions of the displays stack and/or the coverglass may be configured to move or flex within the enclosure. For example, the display stack or coverglass may be configured to move vertically in the z-direction in order to receive a user input via a virtual button. In this implementation, the flexible material may act as a seal by achieving a tight gap between the enclosure and the top of the display stack or coverglass, opposed to forming a tight fit between the edge of the display stack and the side wall of the enclosure that may prevent the display stack from flexing or moving. Thus, the flexible portion allows an air gap or space to be maintained between the interior wall of the enclosure and the edge of the display stack reducing friction when the display stack and/or coverglass is depressed. In some cases, an air gap or distance of approximately 0.5 mm to approximately 0.025 mm may be achieved between the edge of the display stack or coverglass and the interior wall of the enclosure. In other examples, a distance of approximately 0.3 mm and approximately 0.5 mm may be achieved. In one particular example, the distance may be no less than approximately 0.05 mm and no greater than approximately 0.25 mm.

FIG. 1 illustrates an example cross-section of a display stack 102 and display stack enclosure 104 of a left side of an electronic device 100. In general, the enclosure includes a rigid body made up of one or more materials with a back portion and a side wall portion. The enclosure 104 may also include a flexible portion or flexible rim portion extending from the wall portion of the rigid body.

In the illustrated example, the enclosure 104 includes a first portion 106, a second portion 108, and a third portion 110. The first portion 106 may be formed from a rigid or metallic material to protect the display stack 102 (e.g., in the event of dropping), as well as various other components of the electronic device 100 and to provide strength and stiffness to the overall device 100 during use. The second portion 108 may be formed from a plastic material to act as an outer wall of the electronic device 100 exposed to a user.

The third portion 110 may be formed from a flexible material, for example, from TPU, silicones, and/or TPEs. In some cases, the third portion 110 may have a hardness rating in the range of approximately Shore A 60 to approximately Shore A 90. In other cases, the third portion 110 may have a hardness rating of about approximately Shore A 80.

Since the third portion 110 is formed from a flexible material, the display stack 102 may be assembled by applying pressure around the exterior edge of the display stack 102 without requiring moving parts, multiple laminations, and/or multiple adhesives and in some cases, without the need to align the display stack 102 with the enclosure 104. For example, the pressure applied to the top surface of the display stack may cause the third portion 110 to deform out of the way of the display stack 102, while at the same time pushing the display stack 102 into the enclosure 104.

Once the display stack 102 is placed within the enclosure 104, the third portion 110 may reform or return to an original position extending at least partially over the display stack 102 locking the display stack 102 within the enclosure 104. In the original position, the third portion 110 may extend no more than 0.5 mm over the display stack 102 or the coverglass portion of the display stack 102. In other implementations, the third portion 110 may extend no more than 0.3 mm and no less than 0.025 mm in the original position. In one specific implementation, the third portion 110 may extend 0.25 mm over the display stack 102 or the coverglass portion of the display stack 102 in the original position.

The display stack 102 may include various layers that form a display, such as a touch screen display of the electronic device 100. For example, the display stack 102 may include a coverglass to act as an outer surface of the device 100 exposed to a user, a front or back light component for lighting the display, one or more touch layers for receiving user inputs, and a display component to display content.

In general, the enclosure 104 is arranged with respect to the display stack 102, such that the display stack 102 is separated from the inner wall of the enclosure 104 by an air gap, generally indicated by 112. The air gap 112 allows the display stack 102 to move vertically in the z-direction within the enclosure 104 without sticking to or experiencing friction. In some examples, the electronic device 100 also includes a force sensitive sensor (not shown) (or force resistive sensor) configured to detect the vertical movement of or pressure on the display stack 102. In these examples, detection of the vertical movement or pressure may be considered a user input by the electronic device 100. The air gap 112 or distance between the edge of the display stack 102 and the interior wall of the enclosure 104 may be in the range of 0.5 mm to 0.025 mm, in some examples. In other examples, the air gap 112 may be in the range of 0.3 mm to 0.5 mm. In one particular example, the air gap may be no less than 0.05 mm and no greater than 0.25 mm.

In the illustrated example, the third portion 110 is shown as extending over the air gap 112 and over a portion of the display stack 102. In this manner, the third portion 110 may act as a cover or mask to conceal errant light that may become trapped at the edges of the coverglass from the user. For example, in some implementations, the top surface of the coverglass may be treated with a chemical spray to produce a mat finish or etching. However, in some cases, the mat finish causes the coverglass to act as a lightguide causing light to travel out of the coverglass around the edges. In this case, the third portion 110 blocks the light leaking out of the edges of the coverglass from the view of to the user improving the overall user experience.

The enclosure 104 is further configured to maintain a tight fit between the enclosure 104 and the top surface of the coverglass associated with the display stack 102, as well as to maintain the display stack 102 within the enclosure 104. In some cases, the third portion 110 may be sealed (for example, via an optically clear adhesive (OCA)) with top surface of the coverglass to provide an air tight seal in order to protect the display stack 102 from water, dust, and/or other microscopic particles. In this case, the flexibility of the third portion 110 allows the third portion 110 to flex or move with the display stack 102, such that the force sensitive sensor may detect a pressure on or movement of the display stack 102.

Figure 2:
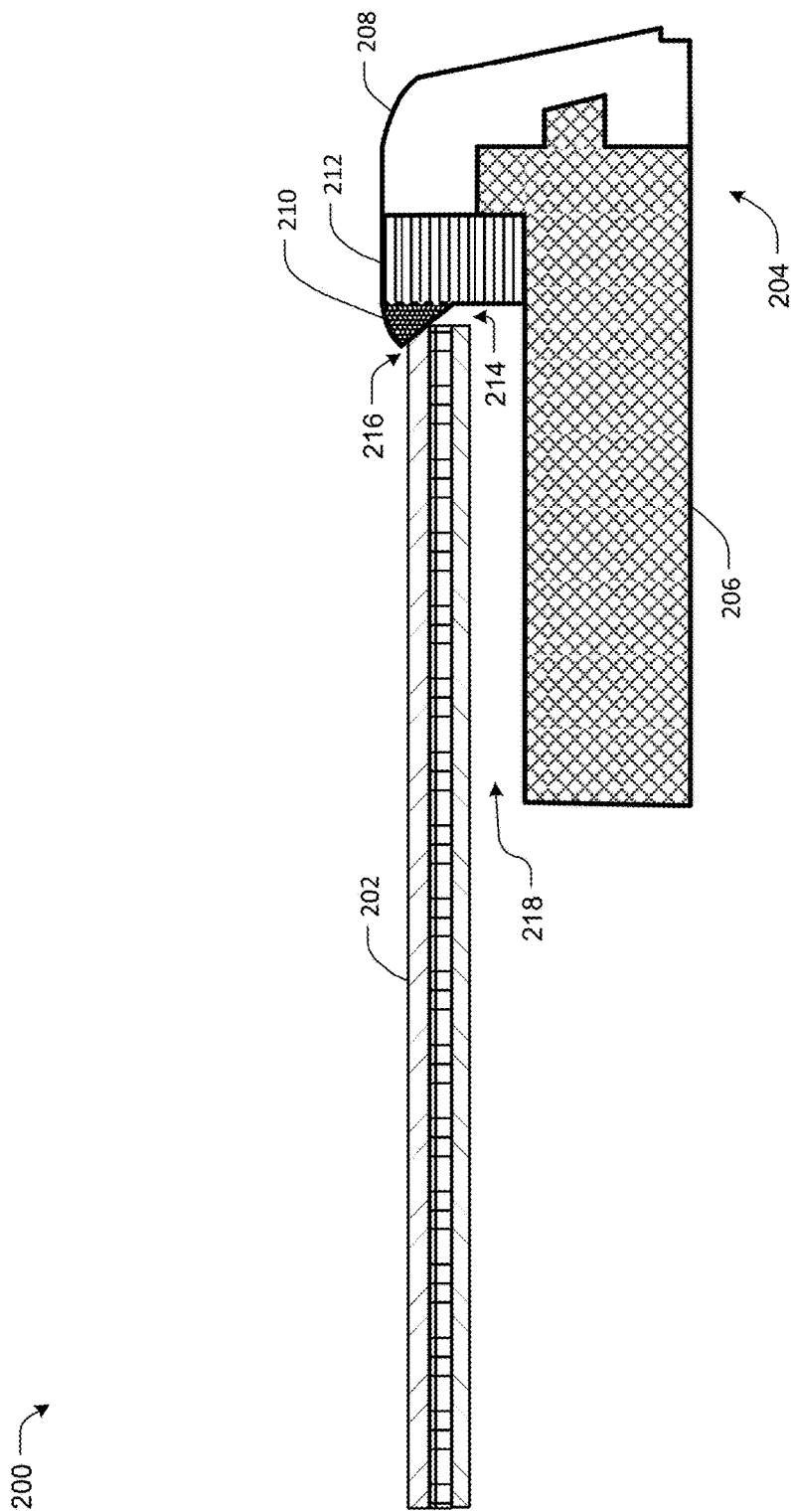
FIG. 2 illustrates another example cross-section of a display stack and display stack enclosure of a second or right side of an electronic device.

FIG. 2 illustrates another example cross-section of a display stack 202 and display stack enclosure 204 of a right side of an electronic device 200. Similar to FIG. 1, the illustrated example shows, the enclosure 204 includes a first portion 206, a second portion 208, and a third portion 210. The first portion 206 may be formed from a rigid or metallic material, the second portion 208 may be formed from a semi rigid or plastic material and the third portion 210 may be formed from a flexible material. Additionally, the illustrated example depicts a fourth portion 212. For example, in some cases, the TPU or TPE material of the third portion 210 may have one or more properties that cause the material to have difficulties in bonding or adhering to the material selected for the first portion 206 or the material selected for the second portion 208. Thus, in some examples, the enclosure 204 includes the fourth portion 212 formed from a material selected to act as a bridge or bonding agent between the third portion 210 and at least one of the first portion 206 and the second portion 208.

As discussed above with respect to FIG. 1, the enclosure 204 is arranged with respect to the display stack 202, such that the display stack 202 is separated from the inner wall of the enclosure 204 by an air gap, generally indicated by 214. The air gap 204 ensures that the display stack 202 may flex or move vertically in the z-direction within the enclosure 204 without sticking to or experiencing friction. The air gap 214 or distance between the edge of the display stack 202 and the interior wall of the enclosure 204 may be in the range of 0.5 mm to 0.025 mm, in some examples. In other examples, the air gap 214 may be in the range of 0.3 mm to 0.5 mm. In one particular example, the air gap 214 may be no less than 0.05 mm and no greater than 0.25 mm.

In the illustrated example, the third portion 210 is shown in an original position extending over the air gap 214 and contacting a top surface (i.e., the top surface of the coverglass) of the display stack 202 at a location generally indicated by 216. In this example, the third portion 210 is configured with respect to the top surface of the display stack 202 to maintain a tight fit between the enclosure 204 and the display stack 202, as well as to conceal the edge of the display stack 202 and the air gap 214. For instance, in the illustrated example, the third portion 210 and the top surface of the coverglass may be sealed (for example, via an optically clear adhesive (OCA)) at location 216 in order to protect the display stack 202 from water, dust, and/or other microscope particles. In this case, the flexibility of the third portion 210 allows, the third portion 210 to flex or move together with the display stack 202.

In some implementations, a second air gap, generally indicated by 218, between the enclosure 204 and the display stack 202 may be formed beneath the display stack 202 to provide space for the display stack to move when depressed by a user. In other implementations, the size of the air gap 218 may be selected such that once the display stack 202 is placed within the enclosure 204, sufficient room remains for the third portion 210 to return to the original position. In some specific implementations, the air gap 218 may be positioned between the coverglass portion of the display stack 202 and the remainder of the display stack 202 (e.g., the lightguide and display components), as will be described in more detail below with respect to FIG. 5.

Figure 3:
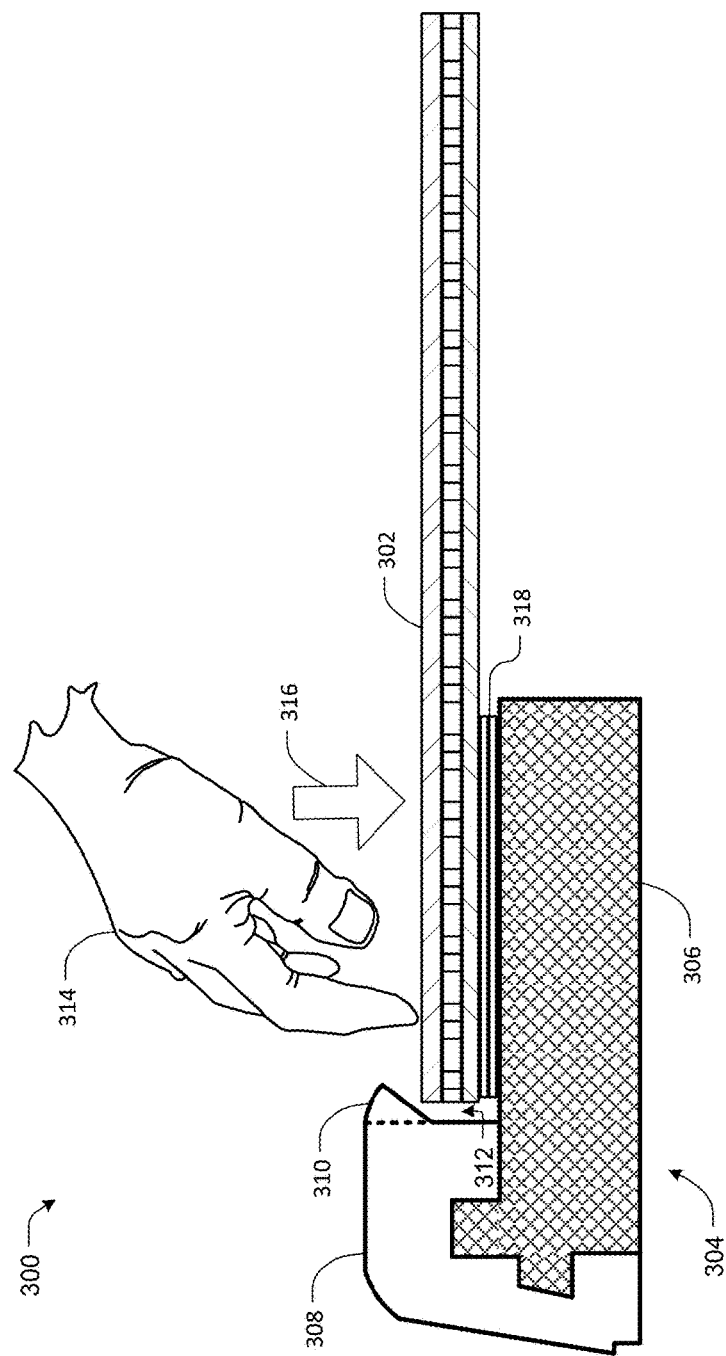
FIG. 3 illustrates an example partial cross-section of an electronic device including a display stack and display stack enclosure depicting a user depressing the left edge of the display stack.

FIG. 3 illustrates an example partial cross-section of an electronic device 300 including a display stack 302 and display stack enclosure 304 depicting a user 314 depressing the left edge of the display stack 302. In the illustrated example, the enclosure 304 includes a first portion 306, a second portion 308, and a third portion 310, as describe above with respect to FIG. 1. In this example, the second portion 308 and the third portion 310 are both formed from the same flexible material, such as TPU or a TPE. For instance, in this example, the first portion 306 may be formed from a rigid or metallic material that may be bonded directly to the flexible material of the second portion 308 and the third portion 310 eliminating the need for a transition material, such the fourth portion 212 describe above with respect to FIG. 2.

As discussed above with respect to FIGS. 1 and 2, the enclosure 304 is arranged with respect to the display stack 302, such that the display stack 302 is separated from the inner wall of the enclosure 304 by an air gap, generally indicated by 312, such that the display stack 302 may flex or move vertically in the z-direction within the enclosure 304 without sticking to or experiencing friction. In the illustrated example, the third portion 310 is shown extending over the air gap 312 to conceal the edge of the display stack 302 and the air gap 312.

In the illustrated example, a user 314 has depressed the left side of the display stack 302 by applying a downward pressure, generally indicated by arrow 316, on the edge of the display stack 302. In response to the pressure 316, the display stack 302, as illustrated, has moved vertically in the z-direction away from the third portion 310. As illustrated, the display stack 302 is able to move without friction or sticking due to the air gap 312 located between the edge of the enclosure 304 and the edge of the display stack 302. In some implementations, the electronic device 300 may detect the movement of the display stack 302, for example, via a force sensitive sensor 318 associated with the left side of the display stack 302. In various implementations, the force sensitive sensor 318 may be configured to detect a compression on the left side of the display stack 302, the pressure 316 on the left side of the display stack 302, or a contact between the display stack 302 and the force sensitive sensor 318. In one particular implementation, the force sensitive sensor 318 may be configured to include a material that when compressed becomes more conductive allowing power to flow through the force sensitive sensor 318 in a detectable manner.

In this implementation, the device 300 may cause the content presented on the display to be refreshed. For example, the detection of the pressure 316 on the left side of the device 300 by the force sensitive sensor 318 may cause the device 300 to navigate backwards through content of an electronic book and the detection of the pressure 316 on the right side of the device 300 via a second force sensitive sensor (not shown) may cause the device 300 to navigate forwards though the content of the electronic book.

Figure 4:
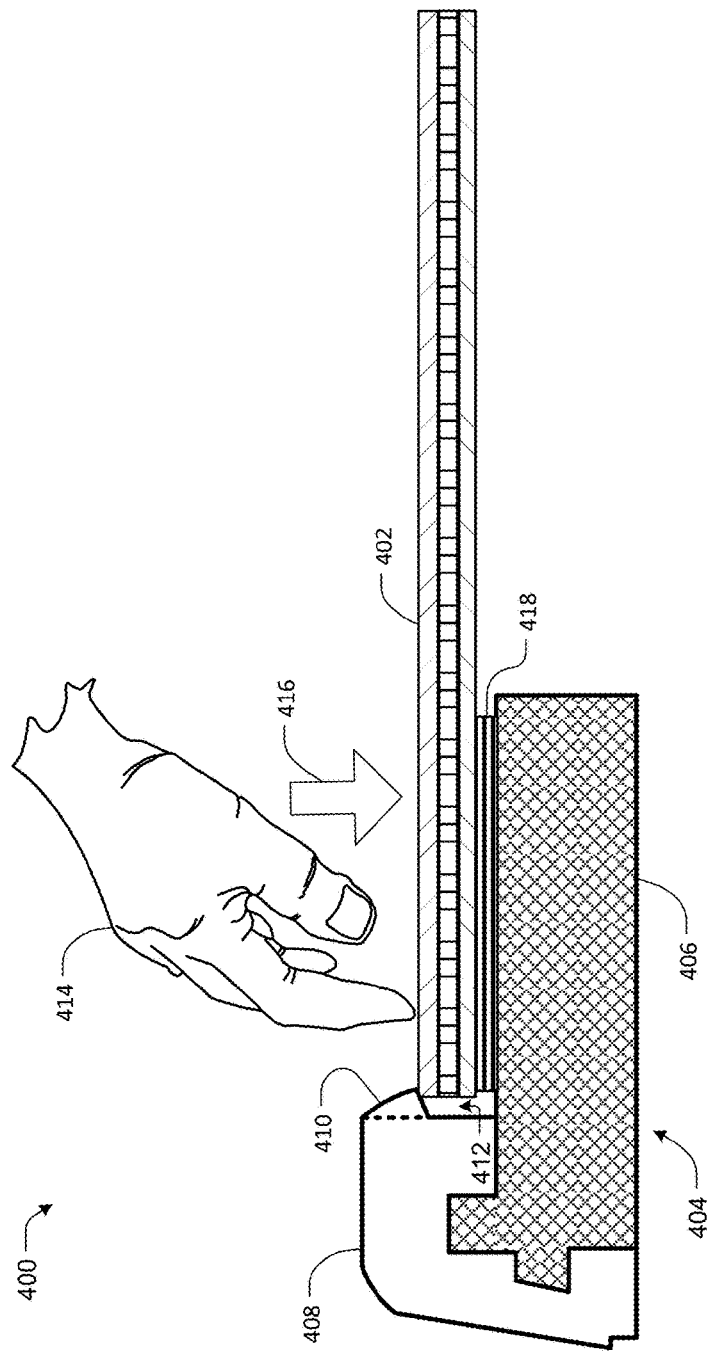
FIG. 4 illustrates another example partial cross-section of an electronic device including of a display stack and display stack enclosure depicting a user depressing the left edge of the display stack.

FIG. 4 illustrates another example partial cross-section of an electronic device 400 including a display stack 402 and display stack enclosure 304 depicting a user 414 depressing the left edge of the display stack 402. In the illustrated example, the enclosure 404 includes a first portion 406, a second portion 408, and a third portion 410, as describe above with respect to FIG. 1. In this example, the second portion 408 and the third portion 410 are both formed from the same flexible material, such as TPU or a TPE, and the first portion is formed from a rigid material, as described above.

The enclosure 404 is arranged with respect to the display stack 402, such that the display stack 402 is separated from the inner wall of the enclosure 404 by an air gap, generally indicated by 412. The air gap 412 allows the display stack 402 to flex or move vertically in the z-direction within the enclosure 404 without sticking to or experiencing friction. In the illustrated example, the third portion 410 is shown as a portion extending over the air gap 412 to conceal the edge of the display stack 402 and the air gap 412.

In the illustrated example, a user 414 has depressed the left side of the display stack 402 by applying a downward pressure, generally indicated by arrow 416, on the edge of the display stack 402. In response to the pressure 416, the display stack 302, as illustrated, has moved vertically in the z-direction. As illustrated, the third portion 410 has deformed to remain in contact with the display stack 402, as the display stack 402 is depressed. For instance, in this example, the third portion 410 may be sealed or otherwise bonded to the top surface of a coverglass associated with the display stack 402 to provide an air tight seal and/or to prevent water, dust, or other microscopic particles from entering the device 400.

In general, the third portion 410 is able to deform or remain in contact with the display stack 402, as the display stack 402 is depressed due to the fact that the third portion 410 is formed form a flexible material (e.g., TPU). Thus, as described herein, the electronic device 400 may be configured to include a display stack 402 that is able to move without friction or sticking due to the air gap 412 located between the edge of the enclosure 404 and the edge of the display stack 402. The movement may trigger a force sensitive sensor 418 capable of detecting a pressure 416 on the top surface of the display stack 402 near the left edge of the display stack 402, while the third portion 410 maintains the seal associated with the enclosure 404 to protect the electronics incorporated into the device 400.

In some implementations, the force sensitive sensor 418 may be configured to detect a compression or pressured 416 on the left side of the display stack 402 or a contact between the display stack 402 and the force sensitive sensor 418 caused by the pressure 416. In one particular implementation, the force sensitive sensor 418 may be a force resistive sensor configured to include a material that when compressed becomes more conductive allowing power to flow through the force sensitive sensor 418 in a detectable manner. In the illustrated example, the force sensitive sensor 418 is shown as residing atop the first portion 406 of the enclosure 404 below the display stack 402, however, in other examples, the force sensitive sensor 418 may be incorporated into the first portion 406.

In some implementations, the device 400 may cause the content presented on the display to be refreshed in response to detecting the pressure 416. For example, the detection of the pressure 416 on the left side of the device 400 by the force sensitive sensor 418 may cause the device 400 to navigate backwards through the content of an electronic book and the detection of the pressure 416 on the right side of the device 400 via a second force sensitive sensor (not shown) may cause the device 400 to navigate forwards though the content of the electronic book.

Figure 5:
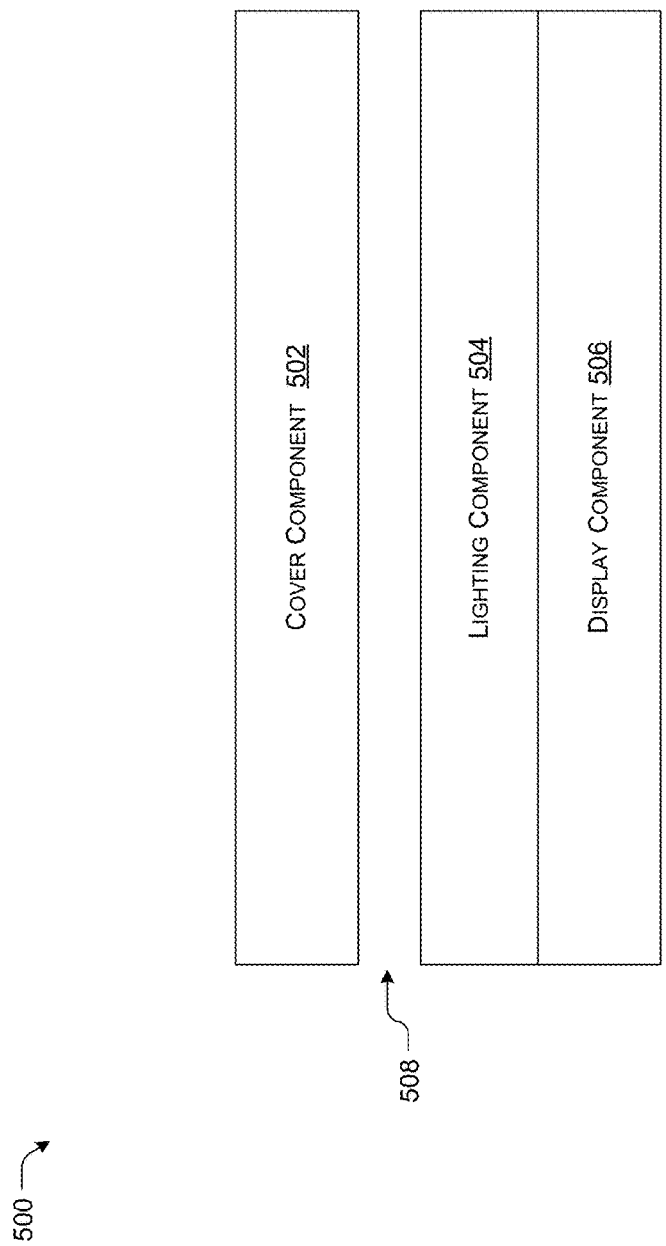
FIG. 5 illustrates another example schematic cross-section of a display stack of an electronic device.

FIG. 5 illustrates an example schematic cross-section of a display stack 500 (such as display stack 102, 202, 302, or 402 of FIGS. 1-4) of an electronic device. The display stack 500 includes a cover component 502, a lighting component 504, and display component 506.

In general, the cover component 502 may be configured to protect the display from damage, such as scratching, chipping, peeling, as well as to provide rigidity and stiffness to the overall device (e.g., to prevent the electronic device from bending or deforming when held). Thus, the cover component 502 may be configured to run the entire width and depth of the electronic device. In some cases, the cover component 502 may include a coverglass layer having a hardness rating that is resistant to a 9H pencil or greater. In general, the cover component 502 may be manufactured to be less than 1.0 mm thick and, in some implementations, may be in the range of 0.5 mm to 0.7 mm.

The lighting component 504 generally includes a lightguide connected to a light source. The lightguide may include a substrate formed from a transparent thermoplastic (such as PMMA), a layer of lacquer and multiple grating elements that function to propagate light from the light source towards the top surface of the display stack 500, thus illuminating the content presented on the display.

In the illustrated example, the front light component 504 resides atop the display component 506. In general, the display component 506 may present content via one or more image producing technologies. In various examples, the display component 506 may include a reflective display, such as an electronic paper display, a reflective liquid crystal display (LCD), or the like. In other implementations, or for other types of electronic devices, the display component 506 may include an active or emissive displays such as a LCDs, plasma displays, a light emitting diode (LED) displays, an organic light emitting diode (OLED) displays, and so forth. Accordingly, implementations herein are not limited to any particular display technology.

The illustrated example also depicts an air gap, generally indicated by 508 positioned below the cover component 502. In this example, the cover component 502 may be configured to move in the z-direction independent of the front light component 504 and the display component 506 when the display stack 600 is depressed by a user. In this example, a force sensitive sensor may be configured to detect the movement of the cover component 502 and in response cause the electronic device to perform various actions. For instance, the electronic device may navigate backwards through content of an electronic book when the force sensitive sensor detects a pressure on the left side of the cover component 502 and navigate forwards though the content of the electronic book when the force sensitive sensor detects a pressure on the right side of the cover component 502.

Figure 6:
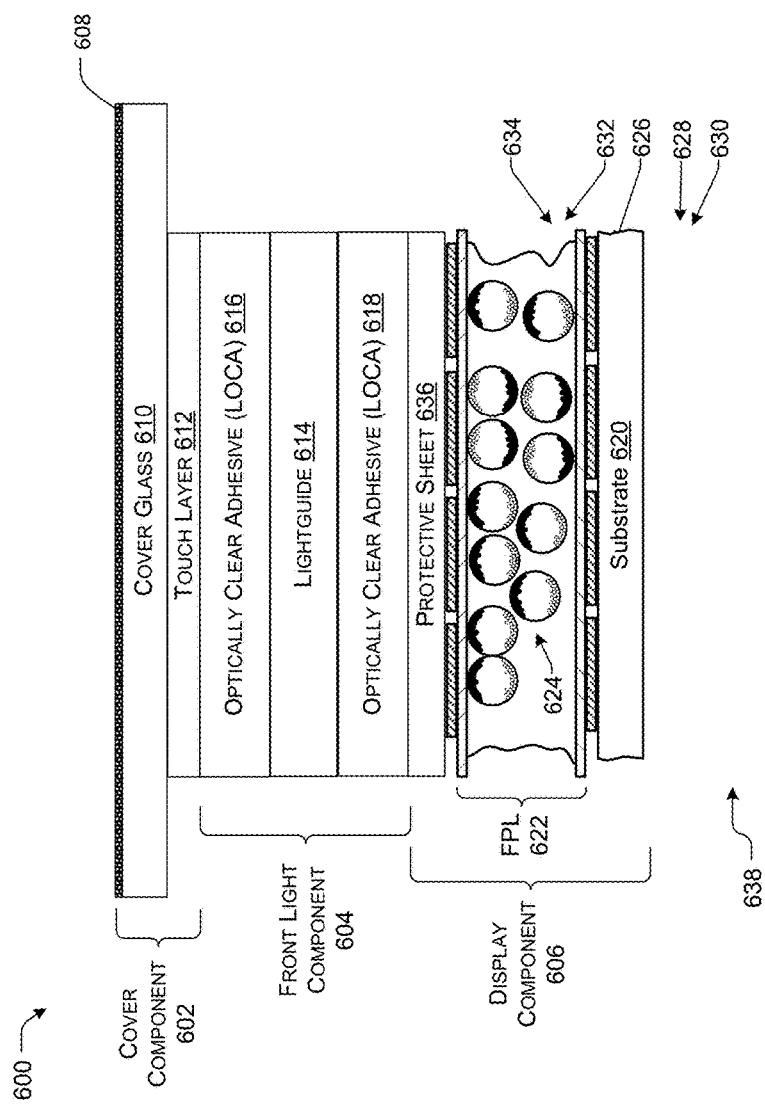
FIG. 6 illustrates an example cross-section depicting an assembly of a display stack of an electronic device.

FIG. 6 illustrates an example schematic cross-section of a display stack 600 (such as display stack 102, 202, 302, or 402 of FIGS. 1-4) of an electronic device. The display stack 600 includes a cover component 602, front (or back) light component 604, and display component 606. In the illustrated example, the cover component 602 includes an outer layer 608 applied to a top surface of the coverglass 610 and a touch layer 612 applied to a bottom surface of the coverglass 610. In some cases, the touch layer 612 may also be electronically coupled to a touch controller (not shown), for example, directly or via a flexible circuit (not shown) to from a touch sensing layer or touch enabled display capable.

In general, the coverglass 610 may be configured to protect the display from damage, such as scratching, chipping, peeling, as well as to provide rigidity and stiffness to the overall device (e.g., to prevent the electronic device from bending or deforming when held). Thus, the coverglass 610 may be configured to run the entire width and depth of the electronic device. In some cases, the coverglass 610 may have a hardness rating that is resistant to a 9H pencil or greater, while in other cases, the coverglass 610 may have a hardness rating between 3H pencil and 9H pencil. In general, the coverglass 610 may be manufactured to be less than 1 mm thick and, in some implementations, may be in the range of 0.5 mm to 0.7 mm.

The outer layer 608 may be formed by applying a coating or film to a top surface of the coverglass 610 to generate a mat finish on the outer surface of the coverglass 610. For example, the top surface of the coverglass 610 may be coated or dipped in a coating that may be cooled or UV-cured. In other examples, a film may be adhered to the top surface of the coverglass 610 using an OCA, for instance, to provide a mat finish to the coverglass 610. In other implementations, the outer layer 608 or mat finish may be selectively etched into the top surface of the coverglass 610. In one example, the etching may be formed by applying a chemical spray or bath to the top surface of the coverglass 610. In some cases, the outer layer 608 may be formed to include additional proprieties such as anti-smudging, anti-fingerprinting properties, and/or anti-cracking properties.

In general, a touch sensor includes a touch pattern (e.g., rows and columns in a grid or diamond shape) coupled to a touch controller. In some particular implementations, the touch layer 612 may be a single layer multi-touch pattern that may be traced upon a single side of a substrate, such as the coverglass 610. The touch layer 612 may include traces made from ITO, printed ink, metal mesh technologies, or the like applied to a bottom surface of the coverglass 610. For example, traces of ITO may be deposited or patterned onto the bottom surface of the coverglass 610 using physical vapor deposition, electron beam evaporation, or sputter deposition techniques, among others. In other examples, a conductive ink may be printed on the bottom surface of the coverglass 610 or a pre-formed metal mesh technology or wiring may be adhered or laminated to the bottom surface of the coverglass 510 to form the touch layer 612. Furthermore, in some instances the touch layer 612 may include a transparent conductor other than, or in addition to those described above.

The front light component 604 generally includes a lightguide 614 connected to a light source (not shown). The lightguide 614 may include a substrate formed from a transparent thermoplastic (such as PMMA), a layer of lacquer and multiple grating elements that function to propagate light from the light source towards the top surface of the display stack 600, thus illuminating the content presented on the display. For example, the lightguide 614 may be formed by applying a layer of lacquer to the substrate to create the grating elements of the lightguide 614, the grating elements may be embossed to the layer of lacquer to from a positive or negative relief and the lightguide 614 may be UV-cured.

In the illustrated example, the two layers of OCA 616 and 618 are arranged above and below the lightguide 614 help maintain the light generated by the light source within the lightguide 614, as well as to join the cover component 602 and the display component 606 with the front light component 604. In general, the OCA layer 616 is arranged atop the lightguide 614 and the OCA layer 618 is arranged beneath the lightguide 614. In some cases, the OCA layers 616 and 618 may be formed from multiple types or layers of OCA selected for various refractive (for example, between 1.39 and 1.5) and/or UV properties (e.g., a luminous transmittance rating of below 5% under 300 nm wavelength).

In the illustrated example, the front light component 604 resides atop the display component 606. As illustrated, the display component 606 is a reflective display that includes the substrate 620, such as of glass or other suitable material, and a front panel laminate (FPL) 622, which serves as the image-displaying component. In this example, the FPL 622 includes capsules, generally indicated by 624, as well as a fluid, generally indicated by 626, in which the capsules 624 are suspended. In addition, the FPL 622 includes a lower plastic film 628 onto which the fluid 626 and capsules 624 are deposited, such as using a roll-to-roll process. A grid or pattern of lower electrodes 630 is associated with the lower plastic film 628. Similarly, an upper transparent plastic film 632 may be located on the upper side of the fluid 626 for containing the fluid 626 and the capsules 624.

The display component, also includes at least one upper electrode 634 associated with the upper film 632. In some examples, the upper electrode 634 may include a grid or pattern of transparent electrodes formed from ITO or other suitable transparent conductive material. For instance, each capsule 624 may include dark and light particles inside the capsule 624. A positive charge on an electrode pair may cause a first color of particle to rise toward the upper plastic film 632 while a negative charge on an electrode pair may cause a second color of particle to rise toward the plastic film 632. A display controller (not shown) may control the charge applied to each electrode pair. Furthermore, in some examples, the pixels (i.e., electrode pairs) may be controlled by applying a sequence of voltages to each pixel, instead of just a single value as in a typical LCD. These sequences of voltages may be referred to as "waveforms," and may be employed to prevent over-charging of the capsules 624, prevent damage to the capsules 624, and so forth.

A protective sheet 636 may be assembled atop the FPL 622, so that the FPL 622 is sandwiched between the protective sheet 636 and the substrate 620. Thus, the protective sheet 636, the FPL 622, and the substrate 620 may be assembled or laminated together to form the display component 606. The protective sheet 636 may include one or more UV properties or a material selected based on a desired refractive index.

The illustrated example also depicts an air gap, generally indicated by 638 positioned below the display stack 600. In this example, the display stack 600 may be configured to move in the z-direction when the display stack 602 is depressed by a user. In other examples, an air gap may be located beneath the cover component 602 and the cover component 602 may be configured to move independent of the front light component 604 and the display component 606. In these examples, a force sensitive sensor may be configured to detect the movement of the display stack 600 or the cover component 602 and in response cause the electronic device to perform various actions. For instance, the electronic device may navigate backwards through content of an electronic book when the force sensitive sensor detects a pressure on the left side of the display stack 600 and navigate forwards though the content of the electronic book when the force sensitive sensor detects a pressure on the right side of the display stack 600.

Figure 7:
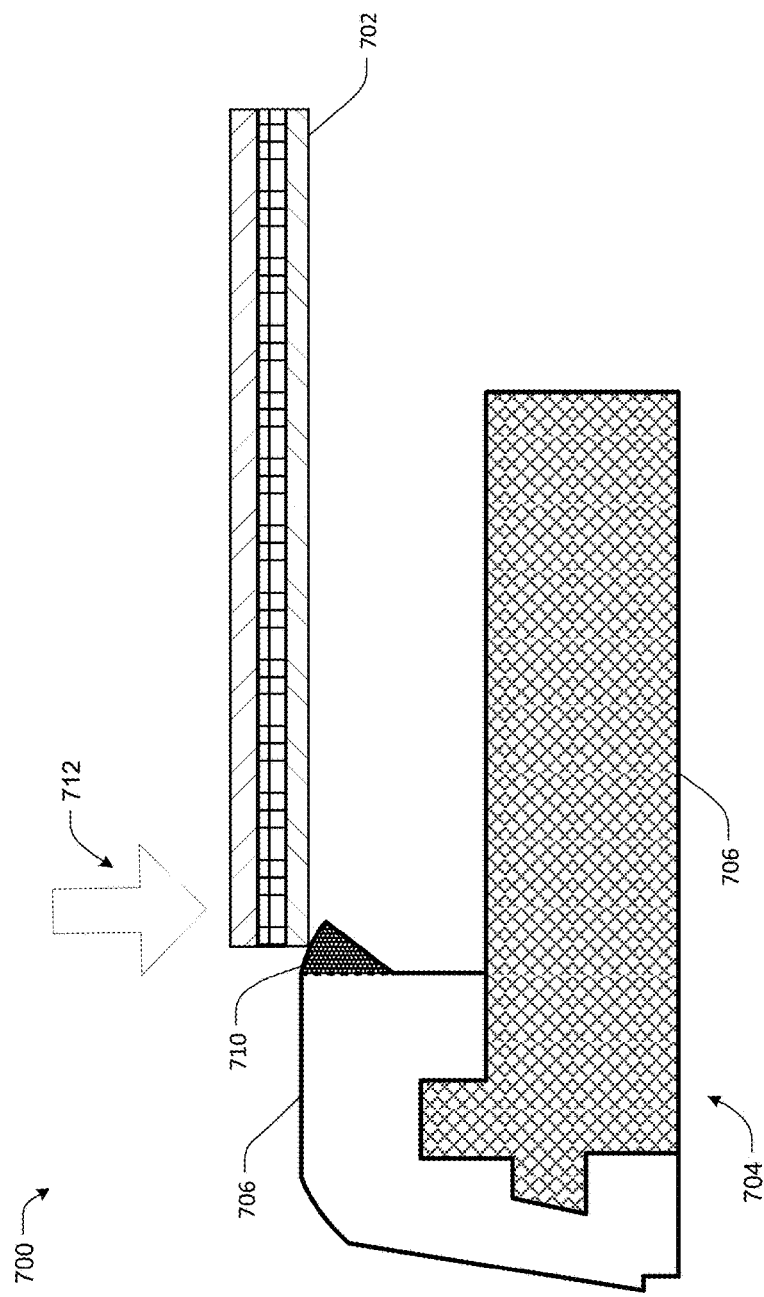
FIG. 7 illustrates an example cross-section depicting the assembly of the display stack of the electronic device of FIG. 6.

FIG. 7 illustrates an example cross-section depicting an assembly of a display stack 702 of an electronic device 700 to illustrate an assembly process. In this implementation, a display stack enclosure 704 of the device 700 includes a first portion 706, a second portion 708, and a third portion 710. The third portion 710 of the enclosure 704 being formed from a flexible or pliable material that may deform, while the display stack 702 is being inserted into the enclosure 704. In the illustrated example, the display stack 702 has been assembled and the edge of the display stack 702 has been aligned with the third portion 710 of the enclosure 704.

Figure 8:
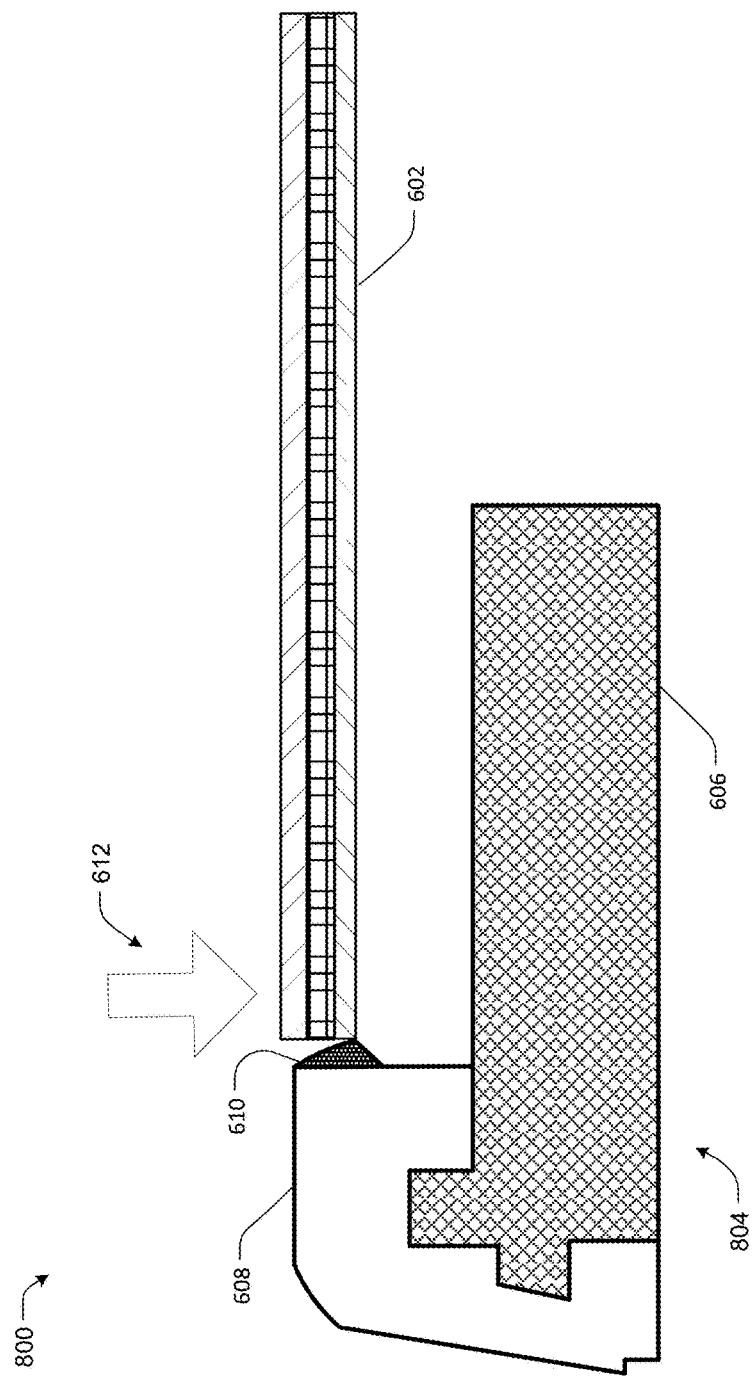
FIG. 8 illustrates an example cross-section depicting the assembly of the display stack of the electronic device of FIG. 6 at a point in the installation process after that shown in FIG. 7.

In general, once the edge of the display stack 702 is aligned with the third portion 710, pressure, generally indicate by arrow 712, may be applied along the edge of the display stack 702 to begin pushing the display stack 702 into the enclosure 704, as depicted by FIG. 8 below. In some instances, a robot may be programmed to walk the edge of the display stack 702 applying even pressure along the edge to slowly force the display stack 702 through the third portion 710 of the enclosure 704 without tearing or permanently deforming the third portion 710.

FIG. 8 illustrates an example cross-section depicting the assembly of a display stack 702 of an electronic device 800 at a point in the installation process after that shown in FIG. 7. In this implementation, sufficient pressure 712 has been applied to the display stack 702 to cause the display stack 702 to deform the third portion 710, as illustrated. At this time, the display stack 702 has been partially inserted into the enclosure 704. Again since the third portion 710 is formed from a flexible material, such as TPE or TPU, the display stack 702 may be inserted via a pressure 712, rather than requiring a complex assembly with moving parts, multiple laminations, and/or multiple adhesives.

In some implementations, the length, thickness, or depth of the third portion 710, as well as one or more properties associated with the material selected to from the third portion 710, may cause the display stack 702 to self align with the center of the enclosure 704. For instance, as the pressure 712 is applied and the third portion 710 fully deforms, the deformed third portion 710 applies a second pressure from all directions around the edge of the display stack 702 forcing the display stack 702 towards the center of the enclosure 704. Thus, in some examples, by forming the third portion 710 out of a flexible material, the display stack 702 may be inserted into the enclosure 704 without the need for manual or robotic alignment of the enclosure 704 and the display stack 702.

Figure 9:
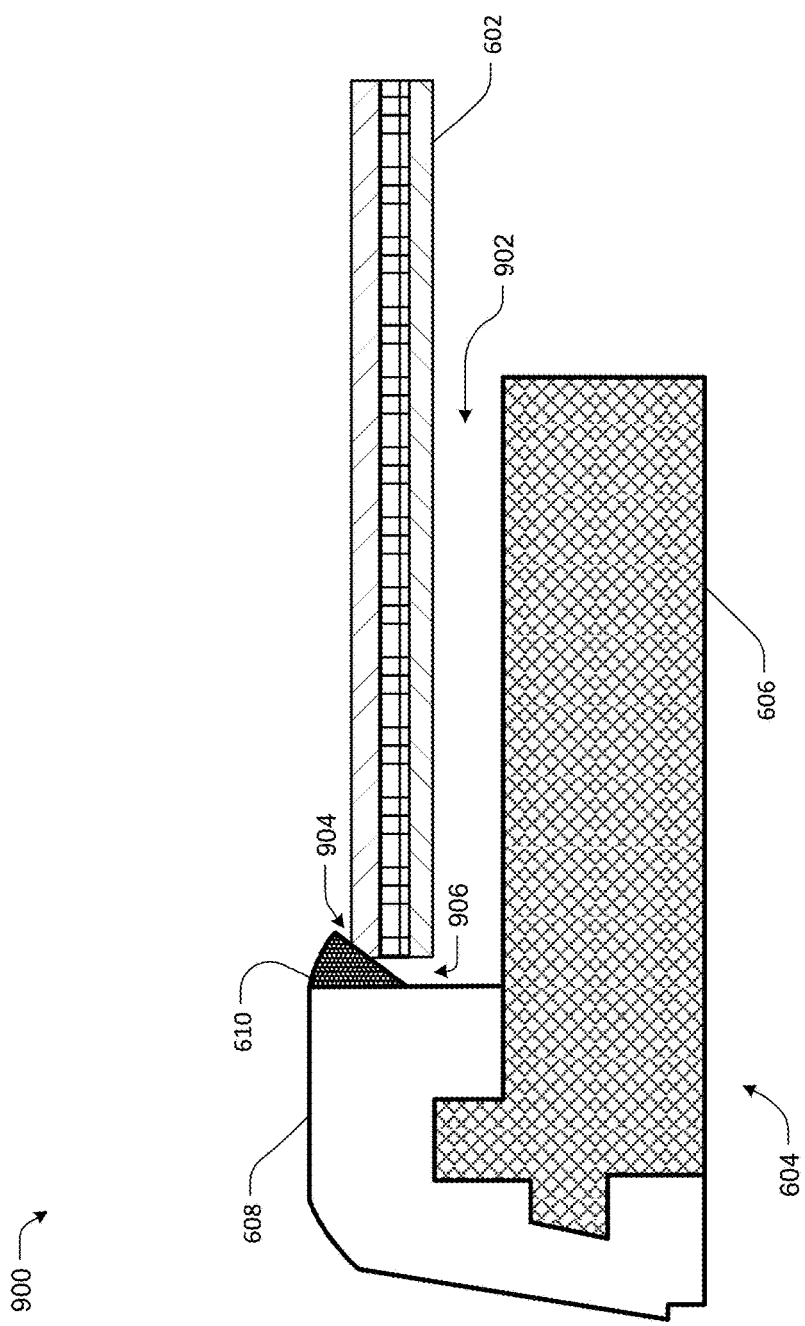
FIG. 9 illustrates an example flow diagram showing an illustrative process for assembling the display stack within the display stack enclosure.

FIG. 9 illustrates an example cross-section depicting the assembly of the display stack 702 of an electronic device 900 at a point in the installation process after that shown in FIG. 8. In the illustrated example, the display stack 702 has been fully inserted into the enclosure 704 and the third portion 710 has returned to its original position. Thus, by forming the third portion 710 from a flexible material, the third portion 710 may act as a bezel or other cover for the edge of the display stack 702, while the display stack 702 may be inserted into the enclosure 704 without requiring moving parts, multiple laminations, and/or multiple adhesives.

In some implementations, an air gap, generally indicated by 902, between the enclosure 704 and the display stack 702 may be formed beneath the display stack 702 to provide space for the display stack 702 when depressed by a user. In some cases, the distance between the enclosure 704 and the bottom of the display stack 702 and/or the top surface of a force restive sensor may be sized to prevent the display stack 702 from being depressed to a degree that the third portion 710 tears, rips, or is permanently deformed. In other implementations, the size of the air gap 802 may be selected to provide sufficient space for the display stack 702 to enter the enclosure 704 and for the third portion 710 to return to an original position after being deformed. In some specific implementations, the air gap 902 and/or the force restive sensor may be positioned between the coverglass portion of the display stack 702 and the reminder of the display stack 702 (e.g., the lightguide and display components), such that the coverglass may be depressed independently from the lightguide and display components.

In some cases, the third portion 710 may be sealed, at a location generally indicated by 904, to the top surface of the display stack 702, once the third portion 710 returns to the original position. The seal may be formed, for example by a liquid OCA applied at the location 904 and UV-cured. The seal acts to protect the display stack 702 from water, dust, and/or other microscopic particles. In this case, the flexibility of the third portion 710 allows, the third portion 710 to flex or move together with the display stack 702 when the display stack 702 is depressed by a user, as illustrated in FIG. 4. By sealing the third portion 710 to the top of the display stack 702, the device 700 may be configured with an air gap, generally indicated by 906, between the edge of the display stack 702 and the interior wall of the enclosure 704. The air gap 906 allows the display stack 702 to flex or move without experiencing friction that may cause the display stack 702 to stick when depressed.

Figure 10:
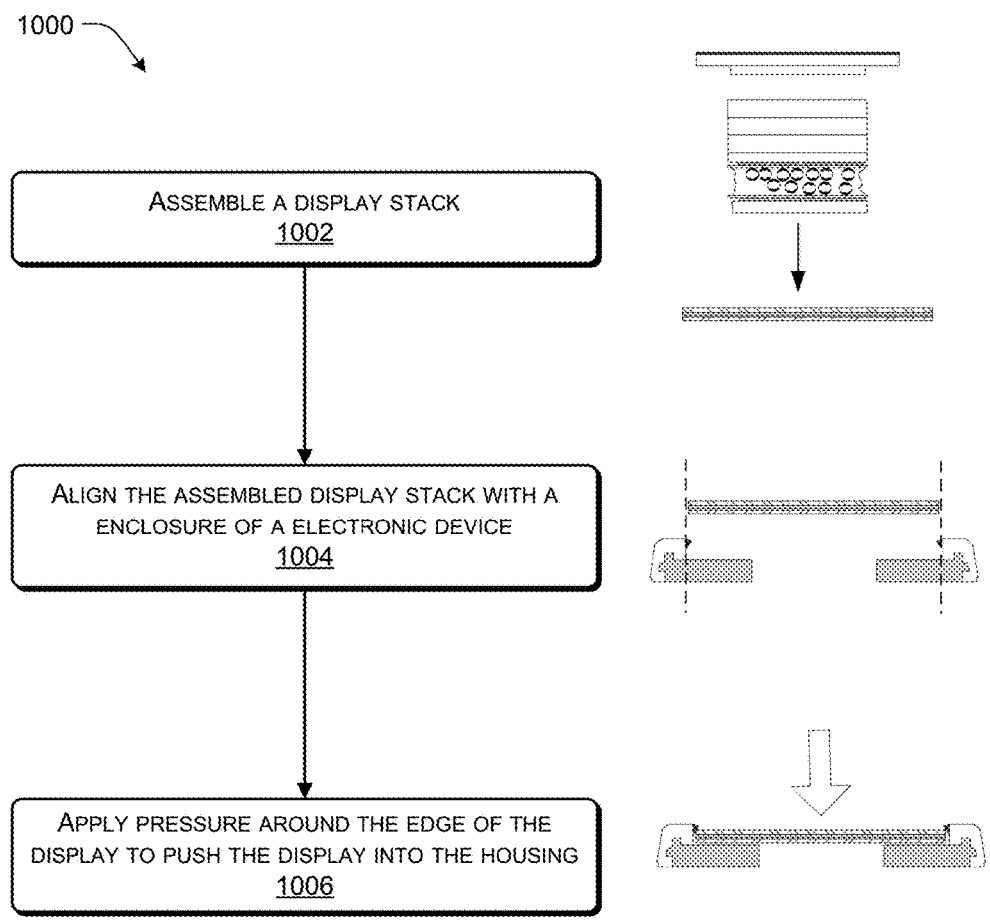
FIG. 10 illustrates an example flow diagram showing an illustrative process for assembling the display stack within the display stack enclosure.
Figure 11:
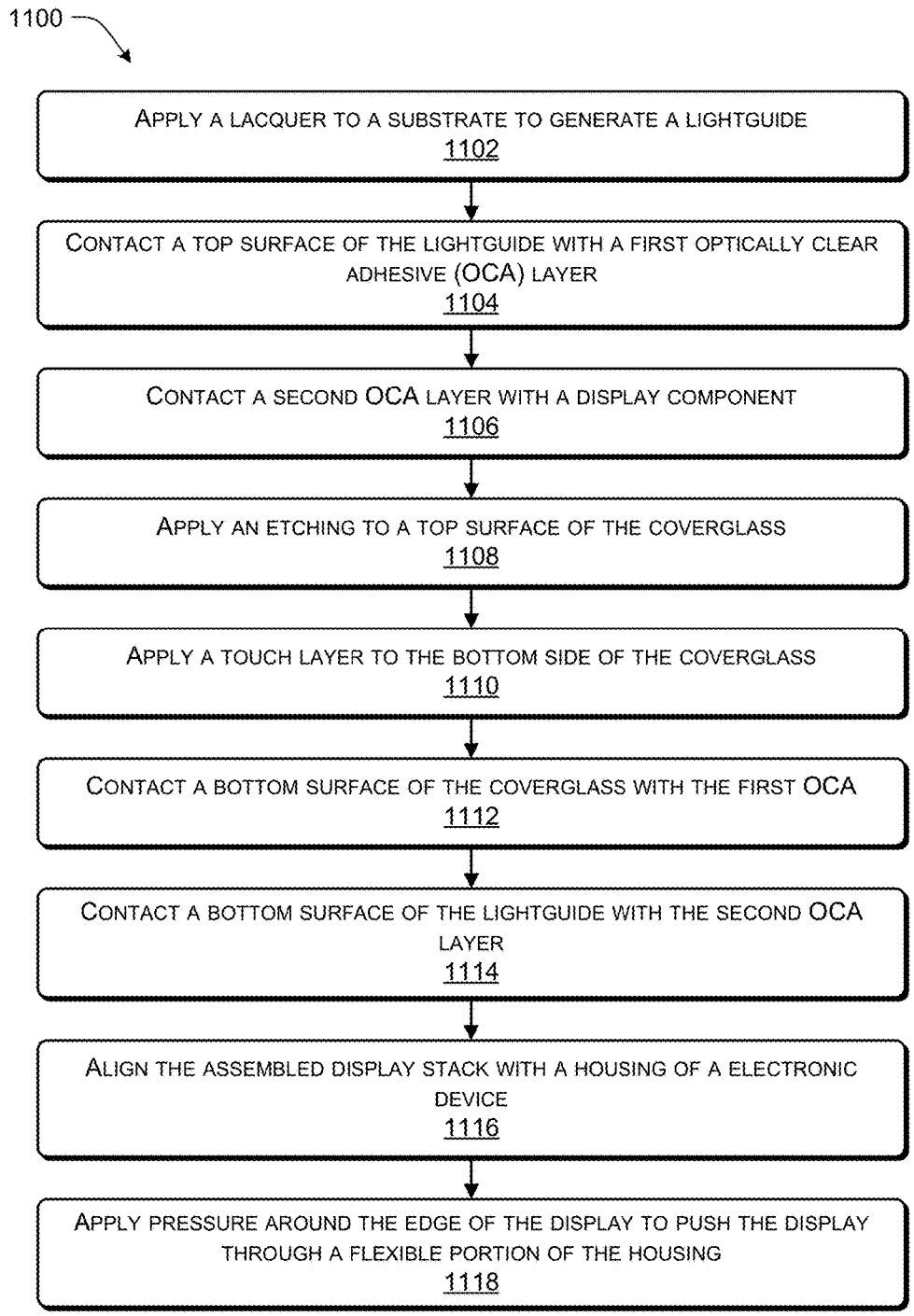
FIG. 11 illustrates an example flow diagram showing an illustrative process for assembling the display stack within the display stack enclosure.

FIGS. 10 and 11 are flow diagrams illustrating example processes for assembling the electronic device, as described above. The processes are illustrated as a collection of blocks in a logical flow diagram, which represent a sequence of operations, some or all of which can be implemented in hardware, software or a combination thereof.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 10 illustrates an example flow diagram showing an illustrative process 1000 for assembling the display stack within the display stack enclosure. For example, the enclosure may include a flexible portion designed to deform during assemble of the display stack and to extend over the edge of the display stack when assembled. Thus, the display stack may be inserted into the enclosure without requiring moving parts, multiple laminations, and/or multiple adhesives.

At 1002, the display stack is assembled. For example, a display stack may include a number of layers or components stacked on top of each other. For instance, in one example, a cover component may be stacked atop a touch component, the touch component stacked atop a front light component, and the front light component may be stacked atop a display component. In some implementations, the various components of the display stack may be joined or adhered together using one or more layers of optically clear adhesive (OCA). For instance, the layers of the display component may be laminated together via a roll to roll or vacuum lamination process.

At 1004, the assembled display stack is aligned with an enclosure of the electronic device. For example, as illustrated with respect to FIG. 7, the edge of the display stack may be aligned with a flexible portion of the enclosure, such that when a pressure is applied to the edge of the display stack, the flexible portion of the enclosure deforms to allow the display stack to pass. In some specific instances, the material or flexibility of the flexible portion may be selected to cause the display stack self aligns when pressure is applied. For example, the flexible portion may be configured to deform only to a predetermined degree or amount forcing the display stack to align correctly with the exterior of the device. In some cases, the predetermined degree or amount may be based in part on the length of the flexible portion, a thickness of the flexible portion, the size and shape of an undercut applied to the flexible portion, the material selected to form the flexible portion, a material the flexible portion is bonded too, among others.

At 1006, a pressure is applied around the edge of the display sack to push the display stack into the enclosure. For example, the pressure may be applied by a robot configured to walk to edge of the display stack and forcing the flexible portion to deform and allowing the edge of the display stack to slide beneath the flexible portion. Once the entire displays stack has passed the flexible portion, the flexible portion is configured to return to its original position locking the display stack within the enclosure.

FIG. 11 illustrates an example flow diagram showing an illustrative process 1100 for assembling the display stack within the display stack enclosure. For instance, in one example, a cover component may be stacked atop a touch component, the touch component stacked atop a front light component, and the front light component may be stacked atop a display component. In some implementations, the various components of the display stack may be joined or adhered together using one or more layers of OCA. For instance, the layers of the display component may be laminated together via a roll to roll or vacuum lamination process, as described in more detail below.

At 1102, a lacquer is applied to a substrate to generate a lightguide. For example, the lacquer may be applied to a PMMA plastic substrate, together with multiple grating elements that function to propagate light from the light source towards the top surface of the display stack. In some examples, the grating elements may be configured to stick out or extend outwards into the lacquer to form a positive relief. The lightguide may then be UV-cured or hardened.

At 1104, a top surface of the lightguide is contacted with a first layer of OCA. The OCA may be a film or a liquid. The OCA may have a predetermined refractive index (e.g., between 1.39 and 1.51) or luminous transmittance rating (e.g., below 5% at a wavelength less than 300 nm) based at least in part on an amount and thickness of the OCA layer or a predetermined, for example, to help maintain the light within the lightguide. The OCA may be cured or hardened to bond the OCA with a top surface of the lightguide. For example, the OCA may be UV-cured on the corners and/or around the perimeter or placed near a center and pressed outwards towards a perimeter of the display stack while UV-curing.

At 1106, a second layer of OCA is contacted with a display component. Similar to the first OCA layer, the second layer of OCA may be cured or hardened to bond the display components into the display stack. For example, the OCA may be UV-cured on the corners and/or around the perimeter, a Liquid OCA may be placed near a center and pressed outwards towards a perimeter of the display stack while UV-curing, or a solid OCA may be die-cut to fit the dimensions associated with the display stack and the resulting OCA layer may be laminated using an auto glaze process.

At 1108, an etching is applied to a top surface of a coverglass. For example, may be etched using a chemical spray to provide a mat or paper like finish to the coverglass. In some cases, the etching may also be configured to provide an antiglare finish to the electronic device.

At 1110, a touch layer is applied to the bottom surface of the coverglass. For example, the touch layer or touch pattern may be formed by depositing traces of ITO onto the bottom surface of the coverglass, printing a conductive ink onto the bottom surface of the coverglass, or adhering a pre-formed metal mesh or wiring to the bottom surface of the coverglass. In some specific examples, the touch layer may be formed by applying ITO to the coverglass using physical vapor deposition, electron beam evaporation, or sputter deposition techniques among others.

At 1112, the bottom surface of the coverglass is contacted with the first layer OCA, for example, to bond the coverglass to the lightguide. In one implementation, the OCA may be hardened in a vacuum under a pressure of 50 Pa or less for 20 to 30 seconds. In other implementations, the OCA may be UV-cured or hardened.

At 1114, a bottom surface of the lightguide is contacted with the second layer of OCA to bond the lightguide to the display component. Again, the OCA layer may be UV-cured or hardened to bond the display component and lightguide together. For example, the OCA may be UV-cured on the corners and/or around the perimeter. Thereafter, the remaining OCA may be UV-cured. By curing the corner(s) and/or perimeter, the techniques effectively create a barrier for the remaining OCA and also prevent the formation of air gaps in the OCA layer, thereby increasing the display stack.

At 1116, the assembled display stack is aligned with an enclosure of the electronic device. For example, as illustrated with respect to FIG. 6, the edge of the display stack may be aligned with a flexible portion of the enclosure, such that when a pressure is applied to the edge of the display stack, the flexible portion of the enclosure deforms to allow the display stack to pass. In some specific instances, the material or flexibility of the flexible portion may be selected to cause the display stack self aligns when pressure is applied. For example, the flexible portion may be configured to deform only to a predetermined degree or amount forcing the display stack to align correctly with the exterior of the device. In some cases, the predetermined degree or amount may be based in part on the length of the flexible portion, a thickness of the flexible portion, the size and shape of an undercut applied to the flexible portion, the material selected to form the flexible portion, a material the flexible portion is bonded too, among others.

At 1118, a pressure is applied around the edge of the display sack to push the display stack into the enclosure. For example, the pressure may be applied by a robot configured to walk to edge of the display stack and forcing the flexible portion to deform and allowing the edge of the display stack to slide beneath the flexible portion. Once the entire displays stack has passed the flexible portion, the flexible portion is configured to return to its original position locking the display stack within the enclosure In some implementations, when the flexible portion is in the original position, the flexible portion extends over the edge of the display stack and may act as a cover or mask to conceal errant light that becomes trapped within the coverglass. For example, as described above, the top surface of the coverglass is treated with a chemical spray to produce a mat finish or etching. However, in some cases, the mat finish causes the coverglass to act as a lightguide causing light to travel out of the coverglass around the edges. In this case, having the flexible portion extend over the edge of the coverglass allows the flexible portion to block light leaking out of the coverglass from the user.

Once the display stack is positioned within the enclosure, such that the display stack is separated from the inner wall of the enclosure by an air gap to allow the display stack may move vertically in the z-direction within the enclosure without sticking to or experiencing friction. The air gap or distance between the edge of the display stack and the interior wall of the enclosure may be in the range of 0.5 mm to 0.025 mm, in some examples. In other examples, the air gap may be in the range of 0.3 mm to 0.5 mm. In one particular example, the air gap may be no less than 0.05 mm and no greater than 0.25 mm.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. An electronic device comprising:
a display stack including:
a coverglass with a top surface and a bottom surface opposing the top surface, the top surface being exposed to an exterior of the electronic device;
a touch layer contacted with the bottom surface of the coverglass;
a lightguide positioned beneath the coverglass and the touch layer; and
a reflective display component positioned beneath the lightguide, the display component configured to display content;
an enclosure for housing the display stack, the enclosure including:
a housing having a bottom and a side surface, the bottom extending at least partially under the bottom surface of the coverglass and the side surface of the housing disposed adjacent to the display stack; and
a bezel in contact with the housing, the bezel having a top portion extending outward from the side surface of the housing a first distance and a bottom portion extending outward from the side surface of the housing a second distance, wherein the first distance is greater than the second distance and wherein the bottom portion of the bezel is closer to the bottom of the housing as compared to the top portion of the bezel, wherein at least a portion of the bezel extends over the top surface of the coverglass, and wherein a portion of the bezel is configured to deform to allow the display stack to be placed within the enclosure, wherein the bezel is formed from a first material that is more flexible as compared to one or more second materials used for the housing.

2. The electronic device as recited in claim 1, wherein the bezel is adhered to the top surface of the coverglass.

3. The electronic device as recited in claim 1, wherein the side surface of the housing is formed from a plastic material and the bottom of the housing is formed from a metallic material.

4. The electronic device as recited in claim 1, further comprising a sensor positioned between the bottom of the housing and the bottom surface of the coverglass, the sensor configured to detect a deflection of the coverglass in response to a pressure applied to the top surface of the coverglass.

5. The electronic device as recited in claim 4, wherein the bezel is configured to apply a steady downward pressure to the top surface of the coverglass to counteract upward forces applied to the bottom surface of the display stack by the sensor.

6. A device comprising:
an enclosure for housing a display stack, the enclosure having:
a first portion forming a bottom of the enclosure and positioned at least partially beneath the display stack;
a second portion forming an interior side wall of the enclosure and positioned adjacent to an edge of the display stack; and
a third portion having a top portion extending a first distance outward from the interior side wall of the enclosure and a bottom portion extending outward from the interior side wall of the enclosure a second distance, wherein the first distance is greater than the second distance and wherein the bottom portion of the third portion is closer to the bottom of the enclosure as compared to the top portion of the third portion, wherein at least a portion of the third portion extends at least partially over the display stack, the third portion formed from a material configured to deform during assembly of the device to allow the display stack to be placed within the enclosure, wherein the material of the bezel is more flexible as compared to one or more second materials used for the first portion and the second portion.

7. The device as recited in claim 6, wherein the material of the third portion has a hardness rating between approximately Shore A 60 and approximately Shore A 90.

8. The device as recited in claim 6, wherein the material is at least one of thermoplastic polyurethane (TPU), styrenic block copolymers (TPE-s), polyolefin copolymers (TPE-s), elastomeric alloys (TEP-v), thermoplasitc coployester, thermoplastic polyamides, or a silicone rubber.

9. The device as recited in claim 6, further comprising a sensor positioned between the first portion of the enclosure and a bottom surface of the display stack, the sensor configured to detect a pressure applied to a top surface of the display stack.

10. The device as recited in claim 6, wherein the third portion is adhered to a top surface of the display stack.

11. The device as recited in claim 6, wherein the third portion is coupled with the second portion via an intermediary material.

12. The device as recited in claim 6, wherein the interior side wall of the enclosure is positioned no more than 0.5 mm and no less than 0.025 mm from the edge of the display stack.

13. The device as recited in claim 6, wherein the material has a hardness rating of approximately Shore A 85.

14. The device as recited in claim 6, wherein the second portion extends no more than 0.25 mm from the interior side wall of the enclosure.

15. The device as recited in claim 6, wherein the third portion is a rim, a perimeter cover, a lip, or a bezel extending over the edge of the display stack.

16. An electronic device comprising:
an enclosure; and
a display stack housed within the enclosure, the display stack including:
a coverglass with a top surface and a bottom surface opposing the top surface, the top surface being exposed to an exterior of the electronic device;
a housing having a bottom and a side surface, the bottom extending at least partially under the bottom surface of the coverglass and the side surface of the housing disposed adjacent to the display stack; and
a bezel in contact with the housing, the bezel having a top portion extending outward from the side surface of the housing a first distance and a bottom portion extending outward from the side surface of the housing a second distance, wherein the first distance is greater than the second distance and wherein the bottom portion of the bezel is closer to the bottom of the housing as compared to the top portion of the bezel, wherein at least a portion of the bezel extends outward from the side surface of the housing over the top surface of the coverglass, wherein a portion of the bezel is configured to deform during assembly of the electronic device to allow the display stack to be placed within the enclosure.

17. The electronic device of claim 16, wherein the enclosure includes:
a first portion forming a bottom of the enclosure and positioned at least partially beneath the display stack;

a second portion forming an interior side wall of the enclosure and positioned adjacent to an edge of the display stack; and a third portion extending from the second portion at least partially over the display stack, the third portion formed from a material configured to deform.

18. The electronic device of claim 17, further comprising a sensor positioned between the first portion of the enclosure and a bottom surface of the display stack, the sensor configured to detect a pressure applied to a top surface of the display stack.

19. The electronic device of claim 17, wherein the third portion is adhered to a top surface of the display stack or is coupled with the second portion via an intermediary material.

20. The electronic device of claim 16, wherein the display stack further includes:

a touch layer contacted with the bottom surface of the coverglass;

a lightguide positioned beneath the coverglass and the touch layer, the lightguide; and a reflective display component positioned beneath the lightguide, the display component configured to display content.

\* \* \* \* \*